United States Patent [19]
Talwar et al.

[11] Patent Number: 5,908,307
[45] Date of Patent: Jun. 1, 1999

[54] FABRICATION METHOD FOR REDUCED-DIMENSION FET DEVICES

[75] Inventors: Somit Talwar, Palo Alto; Karl-Josef Kramer, Menlo Park; Guarav Verma, Palo Alto; Kurt Weiner, San Jose, all of Calif.

[73] Assignee: Ultratech Stepper, Inc., San Jose, Calif.

[21] Appl. No.: 08/792,107

[22] Filed: Jan. 31, 1997

[51] Int. Cl.[6] .................................................. H01L 21/8238
[52] U.S. Cl. ........................ 438/199; 438/486; 438/487; 438/483; 438/508; 438/530; 438/542; 438/557; 438/575; 148/DIG. 61
[58] Field of Search ..................................... 438/199, 486, 438/487, 482, 483, 508, 530, 542, 557, 575, 154, 319, 334, 408; 148/DIG. 61

[56] References Cited

U.S. PATENT DOCUMENTS

| | | | |
|---|---|---|---|
| 4,617,066 | 10/1986 | Vasudev ..................................... | 148/1.5 |
| 4,904,611 | 2/1990 | Chiang et al. ............................. | 437/21 |
| 5,147,826 | 9/1992 | Liu et al. .................................. | 437/233 |
| 5,342,793 | 8/1994 | Santangelo et al. ....................... | 437/25 |
| 5,407,838 | 4/1995 | Ohmishi et al. ........................... | 437/25 |
| 5,470,619 | 11/1995 | Ahn et al. ................................. | 427/578 |

OTHER PUBLICATIONS

S. Prussin, et al., Role of Ion Mass, Implant Dose, and Wafer Temperature on End–of–Range Defects, *J. Electrochem. Soc.*, vol. 137, No. 6, 1912–1914, The Electrochemical Society, Inc., (Jun. 1990).

E. D'Anna, et al., Multilayer Titaninum Nitride and Silicide Structures Synthesized by Multipulse Excimer Laser Irradiation, *Elsevier Science Publishers B.V.*, 353–357, Applied Surface Science 54, (1992).

V. Bohac, et al., Tungsten Silicide Formation by XeC1 Excimer–Laser Irradiation of W/Wi Samples, *Applied Physics A. Solids and Surfaces*, 391–396, Applied Physics A 56, (1993).

E. D'Anna, et al., Laser Synthesis of Metal Silicides, *Applied Physics A. Solids and Surfaces*, 325–335, Applied Physics A 45, (1988).

Richard B. Fair, Damage Removal/Dupant Diffusion Tradeoffs in Ultra–Shallow Implanted $p^+$–n Junctions, *IEEE Transactions on Electron Devices*, vol. 37, No. 10, 2237–2242, (Oct. 1990).

Toshimitsu Akane, et al., Two–Step Doping Using Excimer Laser in Boron Doping of Silicon, *Jpn. J. Appl. Phys.*, vol. 31, Part 1, No. 12B, 4437–4440 (Dec. 1992).

P.G. Carey, et al., A Shallow Junction Submicrometer PMOS Process Without High–Temperature Anneals, *IEEE Electron Device Letters*, vol. 9, No. 10, 542–544, (Oct. 1988).

S. Acco, et al., Avoiding End–of–range Dislocations in Ion–implanted Silicon, *Elsevier Science S.A.*, Materials Science and Engineering B34, 168–174, (1995).

*Primary Examiner*—Peter Toby Brown
*Assistant Examiner*—Long Pham
*Attorney, Agent, or Firm*—Allston L. Jones

[57] ABSTRACT

Pre-amorphization of a surface layer of crystalline silicon to an ultra-shallow (e.g., less than 100 nm) depth provides a solution to fabrication problems including (1) high thermal conduction in crystalline silicon and (2) shadowing and diffraction-interference effects by an already fabricated gate of a field-effect transistor on incident laser radiation. Such problems, in the past, have prevented prior-art projection gas immersion laser doping from being effectively employed in the fabrication of integrated circuits comprising MOS field-effect transistors employing 100 nm and shallower junction technology.

38 Claims, 4 Drawing Sheets

FABRICATION METHOD FOR REDUCED-DIMENSION FET DEVICES

BACKGROUND OF THE INVENTION

1. Field of the Invention

This invention relates to the fabrication of integrated circuits (IC) and, more particularly, to the fabrication of IC comprising metal oxide semiconductor field-effect transistors (MOSFET) employing 100 nm and shallower junctions.

2. Description of the Prior Art

CMOS field-effect transistors (FET) employing 0.25 mm gate length dimensions will soon be commercially available. Fabrication of such 0.25 mm dimension FETs typically employs ion implantation for silicon doping. However, MOSFETs having reduced gate-length dimensions of only 0.18 mm and lower are currently being developed. Reduction of gate lengths necessitates source-drain junction depth scaling. For the 0.18 mm CMOS technology, these junctions depths are projected, by the Semiconductor Industry Association's "The National Technical Roadmap for Semiconductors" (1995), to be at less than 80 nm Such junctions are difficult to form using ion implantation due to ion-channeling and transient enhanced diffusion.

Incorporated by reference herein is in the article "Two-Step Doping Using Excimer Laser in Boron Doping of Silicon," by T. Akane et al., Jpn. J. Appl. Phys. Vol. 31 (December 1992) Pt. 1, No. 12B, pages 4437–4440, which discloses an alternative means for silicon doping. In this regard, further incorporated by reference herein is the article "A Shallow Junction Submicrometer PMOS Process Without High-Temperature Anneals," by P. G. Carey et al., IEEE Electron Device Letters, Vol. 9, No. 10, (October 1988), pages 542—544.

Also incorporated by reference herein are the articles "Role of Ion Mass, Implant Dose, and Wafer Temperature on End-of-Range Defects," by S. Prussin et al., J. ElectroChem. Soc., Vol. 137, No. 6 (June 1990), pages 1912—1914; "Damage Removal/Dopant Diffusion Tradeoffs in Ultra-Shallow Implanted $p^+$-n Junctions," by R. B. Fair, IEEE Transactions on Electron Devices, Vol. 17, No. 10 (October 1990), pages 2237–2241, and "Avoiding End-of-Range Dislocations in Ion-Implanted Silicon," by S. Acco et al., Materials Science and Engineering, B34, (1995) pages 168–174, all of which are directed to ion implantation to effect silicon amorphization.

Were it not for the high thermal conduction in crystalline silicon, ultra-shallow (e.g., less than 100 nm) junction formation would be possible using prior-art projection gas immersion laser doping (P-GILD), due to near surface absorption of the laser light and short laser pulse widths. In this regard, the geometry of an MOSFET device being fabricated results in shadowing and diffraction of the laser light illuminating the device's surface which has a large effect on thermal loading. Unfortunately, the high thermal conduction in crystalline silicon acts to reduce the junction depth at the edges. These thermal conduction effects become apparent as the dimensions of the doped regions approach the thermal diffusion lengths. As a result, the attributes of the doped region are a function of their dimensions and the surrounding geometry. In the case of source/drain doping in a CMOS device, this results in the doped regions not extending up to the gate (negative gate overlap) or the isolation. This presents an unacceptable problem, since device performance suffers due to high parasitic resistances and shorts between the junctions and the wells.

SUMMARY OF THE INVENTION

The fabrication method of the present invention provides a solution to the aforesaid problem of thermal diffusion, thereby permitting P-GILD to be used for achieving ultra-shallow (e.g., less than 80 nm) junction formation.

More particularly, in accordance with the fabrication method of the present invention, a given surface layer of crystalline silicon is first amorphized to a given depth. Thereafter a given amount of doping material is deposited as a film on the surface of the given amorphized surface layer of the silicon. Then at least a portion of the given amorphized surface layer of the silicon is temporarily heated for a certain time to a temperature which is sufficient to melt amorphized silicon but is insufficient to melt crystalline silicon (since the melting temperature of amorphized silicon is substantially below that of crystalline silicon). After the completion of the certain heating time, the melted silicon of the heated portion is permitted to cool, thereby effecting a recrystallization of the silicon of this portion of the given surface layer.

DESCRIPTION OF THE PREFERRED EMBODIMENT

Figure 1:
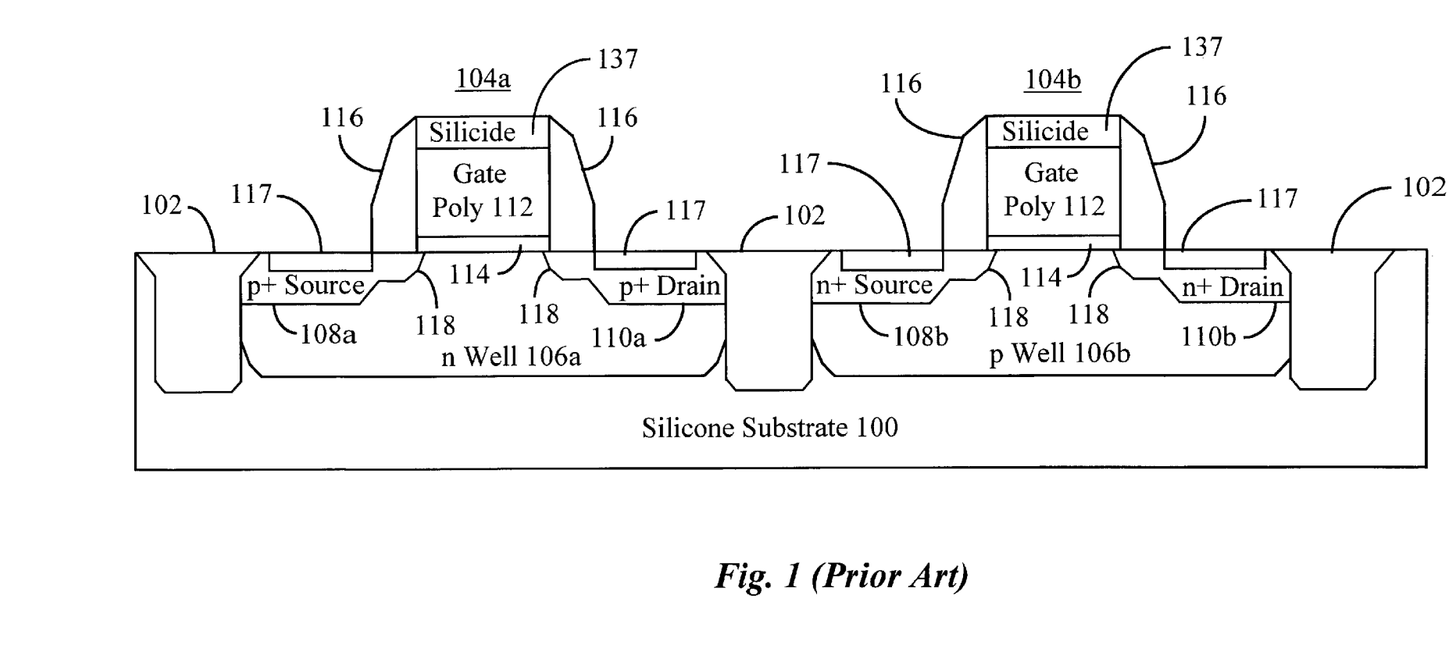
FIG. 1 diagrammatically shows the structure of two FETs that have been fabricated in accordance with modern silicon CMOS technology.

Referring to FIG. 1, there is shown CMOS structure comprising silicon substrate 100, isolation elements 102 and complimentary FETs 104a and 104b. The structure of complimentary FETs 104a and 104b differ only in that FET 104a comprises n well 106a, $p^+$ source 108a and $p^+$ drain 110a, while FET 104b comprises p well 106b, $n^+$ source 108b and $n^+$ drain 110b. In all other respects, the structure of complimentary FETs 104a and 104b is similar. Specifically, both of complimentary FETs 104a and 104b comprise (1) gate poly 112 insulated from the well of that FET by a thin layer 114 of $SiO_2$, (2) side wall spacers 116, (3) silicide electrical contacts 117 situated on top of the respective gate poly, source and drain of each of complimentary FETs 104a and 104b, and (4) shallow doped extensions 118 coupling the source and drain of each of complimentary FETs 104*a* and 104*b* to the channel region under the gate poly.

It is apparent from FIG. 1 that the shallowest junctions are extensions 118, which connect the deep sources and drains to the channel. Extensions 118 are needed to prevent drain induced barrier lowering (DIBL) and punchthrough. The extensions are currently formed by a shallow low energy implant and anneal, after which side wall spacers are formed and deep source/drains implanted.

At this time, the smallest gate dimensions soon to be employed in the commercial fabrication of MOSFET structures is 0.25 mm. In this case, extensions 118 are currently formed by a relatively shallow low energy implant and, thereafter, the $p^+$ and $n^+$ sources 108*a* and 108*b* and drains 110*a* and 110*b* are formed by a relatively deep high energy ion implant. However, when the fabrication of MOSFET structures is scaled down to 0.18 mm gate lengths, the already shallow junction depth of extensions 118 is reduced to less than 80 nm. Such a small junction depth for extensions 118 is difficult to form using ion implantation due to ion-channeling and transient enhanced diffusion.

As discussed above in the Background of the Invention section, problems that result from the high thermal conduction in crystalline silicon have prevented the prior-art P-GILD doping technique from being used in place of ion implantation to form less than a 80 nm deep junction for each of extensions 118.

Figure 2A:
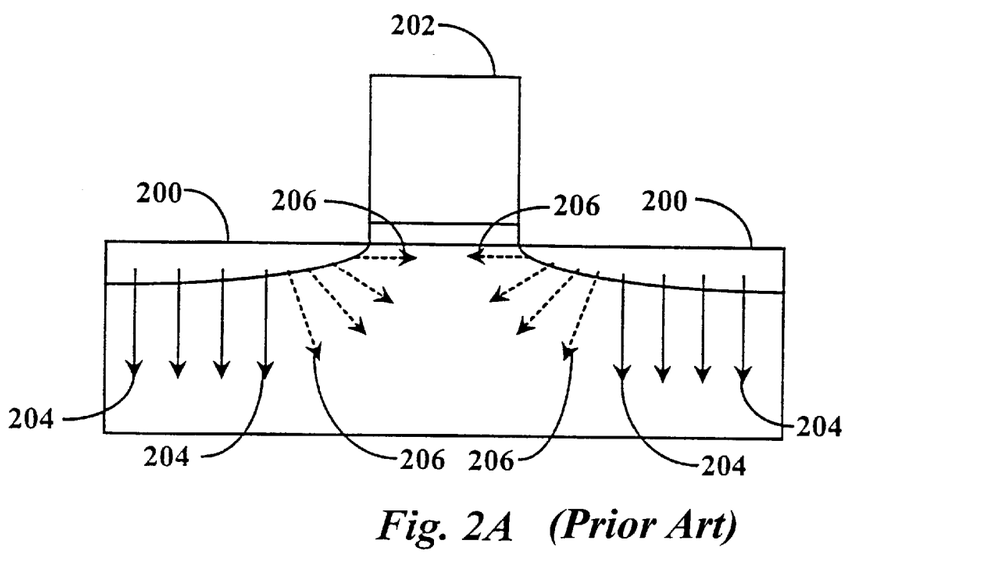
FIG. 2a diagrammatically shows the pattern of heat diffusion from the heated upper region of an MOSFET that occurs when P-GILD is used in its fabrication.

FIG. 2*a* demonstrates only the heat diffusion pattern in that portion of the silicon of the MOSFET being fabricated that is relatively nearer to gate 202 than to the IC isolation elements. Prior-art P-GILD, if used during the fabrication of an IC MOSFET device, would heat the entire single crystalline silicon upper surface layer 200 between adjacent IC isolation elements. Far from gate 202, the heating can be modeled using one-dimensional heat diffusion (as indicated in FIG. 2 by solid-line arrows 204). However, the region under gate 202, which is shadowed from the laser light, remains cooler than regions far from gate 202. Hence, in the vicinity of gate 202, both vertical and lateral, thermal gradient exists. This results in 2-D thermal diffusion in the vicinity of gate 202 (as indicated in FIG. 2*a* by dashed-line arrows 206). Therefore, cooling is enhanced in this vicinity, leading to shallower or no melting, should prior-art P-GILD laser radiation be employed in the fabrication of the FET.

Further, although not shown in FIG. 2*a*, it is apparent that a two-dimensional heat diffusion pattern would also exist during the fabrication of each of the CMOS FETs of FIG. 1 at the junction of that FET's source and drain regions with an isolation element, if prior-art P-GILD laser radiation were employed in its fabrication.

Figure 2B:
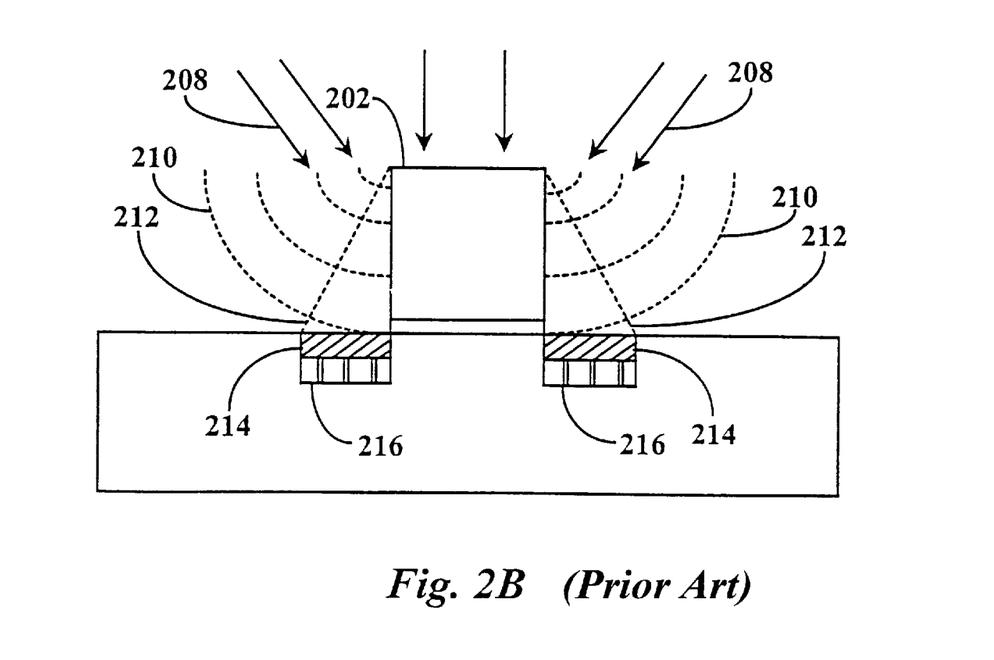
FIG. 2b diagrammatically shows the shadowing and diffraction-interference effects caused by the gate polycrystalline (poly) structure of an MOSFET that occurs when P-GILD is used in its fabrication.

FIG. 2*b* schematically depicts both the shadowing effect 208 and the diffraction-interference effect 210 caused by the presence of the gate 202. More particularly, within the area of the top silicon surface defined by each oblique dashed line 212 and a vertical sidewall of gate 202, the shadowing effect is schematically indicated by boxes 214 and the diffraction-interference effect is schematically indicated by boxes 216.

FIG. 2*b* demonstrates illumination effects near the gate edge. Due to the large numerical aperture of a P-GILD projection system, the angle of incidence varies from 90 to 50 degrees. As a result of angular spread of the illuminating laser light, shadowing by the gate can reduce up to 50% of the light in the region next to it. Some of the fluence loss may be compensated for by additional light reflected off of the silicon sidewall of gate 202. However, it can be shown that silicon exhibits low reflectivity of TM polarized light at near grazing angles. It can be seen that due to this low reflectivity of TM polarized light, a large amount of the light incident on the gate sidewall is in fact absorbed. Hence, reflection off gate 202 cannot completely compensate for the fluence loss due to shadowing. Further, diffraction from the edge of gate 202 and interference between the reflection off of gate 202 and the incident light reduces the incident intensity next to the edge of gate 202. This results in the near gate region being colder than the rest of the source and drain regions.

Thus, the combination of enhanced cooling and shadowing at the gate edge can prevent the melt from extending up to the edge of gate 202. Although it is possible for the melt to reach gate 202 at sufficiently high laser energies, the use of such high laser energies is undesirable. Further, the negative overlap between gate 202 and the melt increases with increasing gate length due to larger thermal gradients under gate 202. A modern circuit may be comprised of devices with varying gate lengths. As a result, the negative overlap will vary for the different devices. A negative overlap results in high series resistances and large leakage to the substrate. Such junctions are unacceptable for modern CMOS technology and methods for ensuring that junctions extend to the gate for all gate lengths needs to be devised.

In addition, two-dimensional cooling can also prevent melting near the edge of an isolation element, thereby causing a short to be created between the junction and the well when silicidation is performed. As a result, the drain cannot be biased with respect to the well. Hence, melting up to the isolation element 102 is extremely important.

The relatively simple process performed by the method of the present invention, shown in FIGS. 3–5 and described below, avoids the aforesaid problems of negative overlay due to two-dimensional cooling and reduction in laser fluence due to shadowing and diffraction-interference, which problems are encountered when prior-art P-GILD laser radiation is employed in the fabrication of the MOSFETs of FIG. 1.

Figure 3:
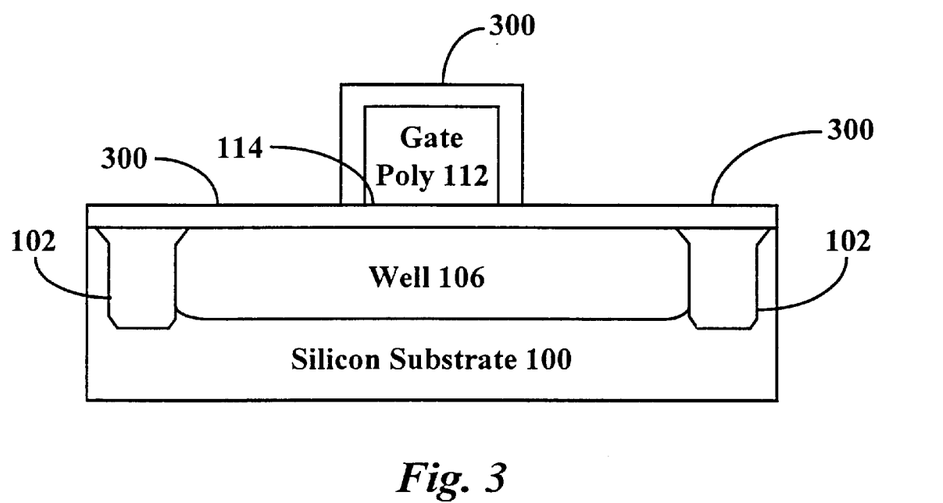
FIG. 3 diagrammatically shows the structure of one of the two FIG. 1 MOSFETs that is to be fabricated in accordance with the method steps of the present invention at a stage in the fabrication of that FET which occurs prior to either the doping of its extensions or the doping of its source or drain, but subsequent to the doping of its well.
Figure 4:
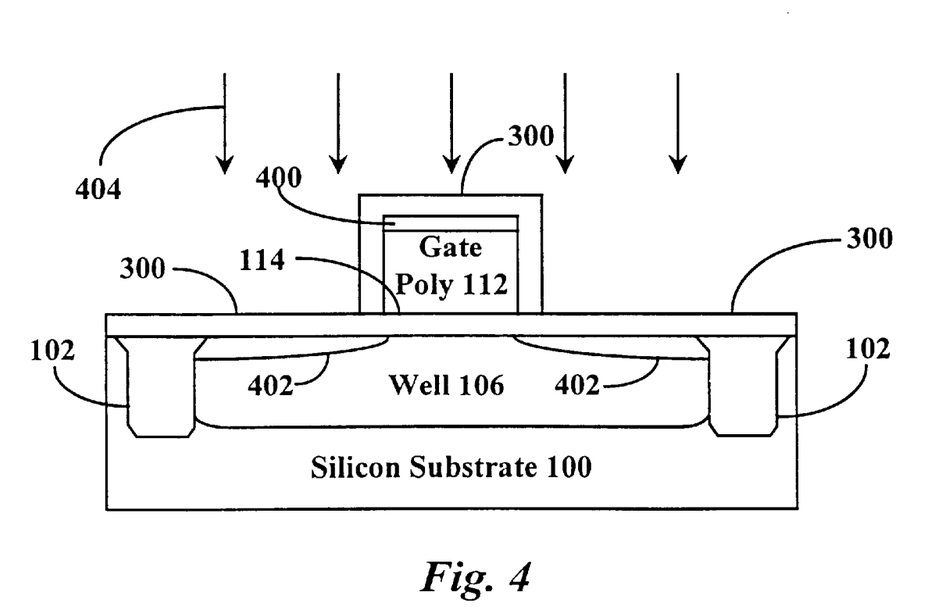
FIG. 4 diagrammatically shows a fabrication step of the present invention comprising surface amorphizing by ion implantating the silicon forming the upper region of the MOSFET of FIG. 3.
Figure 5:
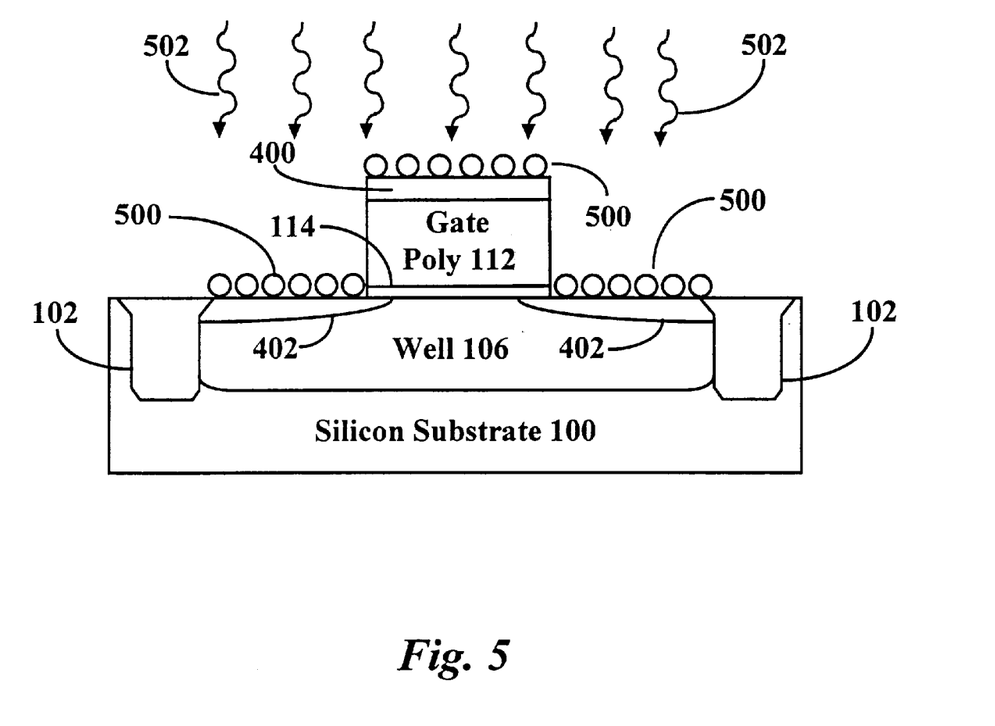
FIG. 5 diagrammatically shows a fabrication doping step of the present invention (which occurs subsequent to both the FIG. 4 fabrication step of surface amorphization and other intervening fabrication steps that include radiation from a first laser operation having been used to photolytically predeposit a film of doping material) which uses the radiation from a second laser to effect a doping which includes both the extensions and the gate poly of that FET with the predeposited film of doping material.

FIG. 3 shows a stage in the fabrication of one of the MOSFETs of FIG. 1 just prior to the execution of fabrication steps which include the fabrication steps of the present invention shown in FIGS. 4 and 5. At the fabrication stage shown in FIG. 3, well 106, and gate poly 112 situated over a thin layer 114 of $SiO_2$ have already been fabricated.

The first of the fabrication steps of the present invention, shown in FIG. 4, comprises the step of amorphizing, to a desired ultra-shallow depth, regions of the FIG. 1 MOSFET being fabricated which include the upper polycrystalline silicon layer 400 of gate poly 112 and the upper single silicon crystalline layers 402 of well 106. Amorphization may be achieved by ion implantation of a heavy atom, such as argon, silicon, and germanium (as indicated in FIG. 4 by arrows 404). However, germanium is to be preferred because it is a heavy atom which requires low doses to amorphize silicon, produces abrupt amorphous-crystalline interfaces, and is isoelectronic in the silicon lattice.

More particularly, as shown in FIG. 4, layer 402 on each side of gate poly 112, which is to be amorphized, extends all the way to an isolation element 102. Assuming, by way of example, that the desired ultra-shallow depth of the layers 400 and 402 to be amorphized is substantially 300 Å (which is less than 80 nm), a dose of $2 \times 10^{14}$ atoms/cm$^2$ is required to achieve this desired 300 Å amorphization depth. A 20 KeV germanium implant at a dose of $2 \times 10^{14}$ atoms/cm$^2$ achieves this desired 300 Å amorphization depth of the layers 400 and 402. This implant condition is easily obtainable using existing implanters.

As is known (see the aforesaid R. B. Fair article incorporated by reference), the amorphous depth is a function of implant dose and implant energy. Depending on the desired amorphous depth, the range of implant dose is between $1\times10^{13}$ atoms/cm$^2$ and $1\times10^{16}$ atoms/cm$^2$, while the range of implant energy is between 5 KeV atoms/cm$^2$ and 400 KeV.

Subsequent to the completion of the silicon amorphization fabrication step of FIG. 4, two fabrication steps (neither of which is shown in the drawing) take place which comprise (1) the removal of thin layer 300 of SiO$_2$, followed by (2) the first step of a known P-GILD operation (e. g., that disclosed above in the article "Two-Step Doping Using Excimer Laser in Boron Doping of Silicon," by T. Akane et al.) which uses an ArF excimer laser (l=193 nm) to decompose, presumably by photolytic decomposition, a given dopant compound in gaseous form to thereby cause a film of doping material in solid form to be predeposited on the upper surfaces of the MOSFET being fabricated. The amount of the dose to be incorporated in amorphized layers 400 and 402 during the second step of the known P-GILD operation depends on the amount of the given dopant compound that has been predeposited during the first step of the known P-GILD operation.

Referring to FIG. 5, there is shown the second step of the P-GILD operation, which takes place at the completion of the aforesaid two unshown fabrication steps. As shown in FIG. 5, predeposited film 500 of doping material on the upper surfaces of layers 400 and 402 of the MOSFET being fabricated is illuminated by excimer laser radiation 502. While this excimer laser radiation may be derived from an ArF excimer laser producing radiation at a wavelength of 193 nm (as taught in the T. Akane et al. article), it also may be derived from other types of lasers (e.g., a 248 nm KrF laser, a 351 nm XeF laser, or a 308 nm XeCl laser). Applicant has employed a pulsed XeCl excimer laser producing radiation at a wavelength of 308 nm for performing the aforesaid second step of the P-GILD operation.

More particularly, amorphous silicon has a factor of 10 lower thermal conductivity, a 300° C. lower melt temperature, and a 30 percent lower reflectivity than crystalline silicon. The combination of these effects lowers the melt threshold of amorphous silicon compared to crystalline silicon.

Referring again to FIG. 1, in the process for forming extensions 118, the depth of the amorphized layers is limited to that needed for the regions to be occupied by each of these extensions. Thereafter, the second step of the P-GILD operation, used in lightly doping the regions of extensions 118, results in the amorphized layers of silicon melting right up to the edge of gate poly 112, due to the significant reduction in the thermal conductivity and melt temperature of these amorphized layers. More specifically, the second step of the P-GILD operation comprises each of successive pulses of laser radiation. The irradiating energy of each of the successive pulses is sufficient to cause melting of an amorphized silicon spot, but is insufficient to cause melting of a crystalline silicon spot. After the completion of the first irradiation of a particular spot by a laser pulse, the now-doped melted silicon thereof immediately cools and recrystallizes. Therefore, the irradiation by a first pulse of a given amorphized silicon spot that overlaps the recrystallized silicon of an already irradiated spot will not cause any remelting of the recrystallized silicon, but will result only in the melting of the given amorphized silicon spot. Further, a large energy window exists where melting will not extend beyond the amorphous regions, since the liquid silicon is highly undercooled and cannot produce further silicon melting. Hence, amorphization can be used to define the melt depth.

While the fluence range for laser irradiation extends all the way from 0.05 Joules per cm$^2$ and 1.0 Joules per cm$^2$, the most likely radiation fluence sufficient to heat amorphized silicon to its melting temperature, but insufficient to heat crystalline silicon to its melting temperature, is 0.4 Joules per cm$^2$.

As indicated in FIGS. 4 and 5, layer 400 of gate poly 112 is both amorphized and doped. In the case that doping of gate poly 112 is not desired, a masking layer over gate poly 112 may be employed during the amorphization implanting step of FIG. 4, thereby preventing gate melting of gate poly 112 to take place during the second step of the P-GILD operation.

While the use of two steps of P-GILD following silicon preamphorization is particularly suitable for fabricating the ultra-shallow (i.e., less than 100 nm depth) junctions of extensions 118, as described above, the same two steps of P-GILD following silicon preamphorization may be used to dope the deep source and drain regions of a MOSFET being fabricated. Specifically, following the fabrication of the ultra-shallow junctions of extensions 118, side wall spacers 116 are fabricated. Thereafter, each the deep source and drain regions located between each side wall spacer 116 and an isolation element 102 is reamorphized to its greater desired depth than the depth of the above-described original amorphization thereof. This may be accomplished with higher energy (e.g., 40 KeV) and higher dose (e.g., $6\times10^{14}$ atoms/cm$^2$ germanium implants). Following such reamorphization, the two steps of P-GILD are used to provide (1) appropriate deposited concentrations of films of doping material during the first of these two steps, and (2) appropriate pulsed laser energy to effect melting of only the amorphised source and drain regions during the second of these two steps.

One reason for employing the steps of the present invention described in the preceding paragraph for doping the deep source and drain, rather than conventional ion-implant doping, is that the doping depth is more precisely controlled. An additional reason is that it is less expensive.

In the method of the preferred embodiment of the present invention described above, the fabrication of the deep source and drain involve the reamorphization of the already-fabricated ultra-shallow (i.e., less than 100 nm depth) junctions, since these already-fabricated ultra-shallow junctions extend all the way to side wall spacers 116. However, it should be understood that the extent of the ultra-shallow junctions may be limited to solely the locations of the extensions and, therefore, not include the locations of the deep source and drain. In this case, the amorphization for the source and drain locations is independent of the amorphization for the extension locations, so that the amorphization for the source and drain locations may occur either before or after the amorphization for the extension locations. Furthermore, the present invention may be employed for fabricating only the extensions of an MOSFET or, alternatively, only the deep source and drain of an MOSFET, rather than both of these.

As known, amorphization implants produce supersaturation of point defects. Upon annealing, point defect injection results in nucleation of extended defects. A critical annealing temperature ordinarily is required to anneal out the extended defects. This ordinarily required anneal for the first amorphization implant, shown in FIG. 4 and described above, is at 1050° C. for 10 sec. However, the laser melting of the amorphized silicon by the second step of the P-GILD operation inherently provides a certain amount of annealing.

Further, due to the small number of point defects present after the laser process, the junctions are not likely to move much as a result of this thermal cycle. Therefore, in this case, no additional anneal for laser annealed junctions may be necessary. However, in any given case, the exact extent of the diffusion after laser annealing needs to be determined experimentally in order to determine if any additional annealing is necessary.

What is claimed is:

1. In a method for fabricating source drain junctions of an MOSFET on a semiconductor substrate with a crystalline semiconductor surface layer, wherein said method comprises the steps of:

(a) amorphizing a portion of said crystalline semiconductor surface layer of said substrate to create an amorphized surface layer with a designed amorphization depth;

(b) depositing or implanting an amount of a doping material as a film on said amorphized surface layer to achieve a designed impurity level in said amorphized surface layer; and (c) heating at least a portion of said amorphized surface layer to a temperature sufficient to melt said amorphized surface layer and insufficient to melt said crystalline semiconductor surface layer resulting in said film of doping material diffusing into said melted amorphized surface layer with said amorphized surface layer recrystallizing upon cooling.

2. The method defined in claim 1, wherein said semiconductor substrate is a crystalline semiconductor material.

3. The method defined in claim 1, wherein step (a) comprises the step of:

(d) implanting atoms of an appropriate element at a designed concentration per unit area with said atoms having been ionized and accelerated to a sufficient energy level by an ion implanter.

4. The method defined in claim 3, wherein said element is germanium.

5. The method defined in claim 3, wherein said concentration per unit area of said element is substantially $2 \times 10^{14}$ atoms/cm$^2$ and said energy level is substantially 20 KeV.

6. The method defined in claim 3, wherein said concentration per unit area of said element is substantially $6 \times 10^{14}$ atoms/cm$^2$ and said energy level is substantially 40 KeV.

7. The method defined in claim 1, wherein step (b) comprises the step of:

(d) employing radiation from a laser to decompose said doping material into a gaseous form that is deposited in solid form as said film on said amorphized surface layer.

8. The method defined in claim 1, wherein step (c) comprises the step of:

(d) employing a an appropriate level of radiant fluence from a laser to effect said heating of at least said amorphized surface layer.

9. The method defined in claim 8, wherein said level of radiant fluence from said laser is substantially 0.4 Joules per cm$^2$.

10. The method defined in claim 8, wherein step (d) comprises the step of:

(e) applying a single one of successive pulses of radiant energy from a pulsed laser to an irradiated area of said amorphized surface layer to heat said irradiated area for a duration of that single one of said successive pulses, the radiation energy of that single one of said successive pulses being sufficient to heat said irradiated area of the underlying amorphized surface layer to the melting temperature of said amorphized surface layer and insufficient to heat said crystalline semiconductor surface layer to the melting temperature of said crystalline semiconductor surface layer.

11. In an integrated circuit fabrication method for fabricating MOSFETs on a semiconductor substrate, wherein adjacent FETs are separated from one another by isolation elements and each fabricated FET comprises (1) a semiconductor gate built up over (2) the surface of an appropriately-doped single crystalline semiconductor well, (3) first and second sidewall spacers situated, respectively, on either side of said semiconductor gate, (4) a relatively deep appropriately-doped single crystalline semiconductor source extending longitudinally from a first isolation element to a part adjacent to said first sidewall spacer, (5) a relatively deep appropriately-doped semiconductor drain extending longitudinally from a second isolation element to a part adjacent to said second sidewall spacer, (6) a first ultra-shallow semiconductor extension situated under said first sidewall spacer for connecting said source to a gate edge proximate thereto, and (7) a second ultra-shallow semiconductor extension situated under said second sidewall spacer for connecting said drain to a gate edge proximate thereto; wherein said method comprises the following steps for fabricating each of said first and second ultra-shallow, doped semiconductor extensions subsequent to the fabrication of said well and said semiconductor gate and prior to the fabrication of said first and second sidewall spacers:

(a) ion implanting atoms of an appropriate element in each of first and second surface layers of said single crystalline semiconductor well that extend longitudinally from a gate edge of said semiconductor gate to an isolation element at a designed concentration per unit area and at an appropriate energy level to amorphize said first and second layers to a certain depth which is less than 100 nm deep;

(b) depositing an amount of doping material to dope said extensions as a film in solid form on said first and second amorphized surface layers by decomposing an appropriate dopant compound in gaseous form with radiation to achieve a designed impurity level in said first and second amorphized surface layers;

(c) applying a first pulse of a number of successive pulses of radiant energy from a pulsed laser to each of said of first and second amorphized surface layers to heat a first area for a duration of said first of said successive pulses, and thereafter serially applying other of said successive pulses of radiant energy from said pulsed laser to other areas of said first and second amorphized surface layers with each successive area overlapping the previous irradiated area of said first or second amorphized surface layer to heat each of said other areas for the duration of a single one of said successive pulses, the radiation energy of each separate one of said successive pulses being sufficient to heat said first or second amorphized surface layer in said area irradiated thereby to the melting temperature of said first or second amorphized surface layer and insufficient to heat said underlying crystalline semiconductor to the melting temperature of said underlying crystalline semiconductor; and (d) providing a time interval between the application of each successive pulse sufficient to permit the melted area of said first or second amorphized surface layers to recrystallize and cool to an initial temperature prior to the application of a successive pulse to said first or second amorphized surface layer.

12. The method defined in claim 11, wherein said concentration per unit area of said ion-implanted atoms is substantially $2 \times 10^{14}$ atoms/cm$^2$ and said energy level is substantially 20 KeV.

13. The method defined in claim 11, wherein said ion implanted atoms are germanium.

14. The method defined in claim 13, wherein said concentration per unit area of said ion-implanted germanium atoms is substantially $2 \times 10^{14}$ atoms/cm$^2$ and said energy level is substantially 20 KeV with the amorphized depth of said first and second layers being substantially 300 Å.

15. The method defined in claim 11, further wherein step (a) further comprises ion implanting germanium atoms in an upper surface layer of said polycrystalline semiconductor gate at a designed concentration per unit area and at a sufficient energy level to amorphize said upper surface layer of said polycrystalline semiconductor gate to a depth of substantially 300 Å.

16. The method defined in claim 11, further comprising the following steps for fabricating each of said relatively deep appropriately-doped semiconductor source and drain subsequent to the fabrication of said first and second sidewall spacers:

(a) ion implanting atoms at a concentration of substantially $6 \times 10^{14}$ atoms/cm$^2$ and at an energy level of 40 KeV in each of (1) a source layer that extends longitudinally from an edge of said first sidewall spacer to an isolation element and (2) a drain layer that extends longitudinally from an edge of said second sidewall spacer to an isolation element resulting in the amorphization of said source and drain layers to a relatively deep depth;

(b) depositing a an amount of doping material to dope said source and drain layers as a film in solid form on the surface of said amorphized source and drain layers by photolytically decomposing an appropriate dopant compound in gaseous form to achieve a desired impurity level in said amorphized source and drain layers;

(c) applying a first of a selected number of successive pulses of radiant energy from a pulsed laser to each of said amorphized source and drain layers to heat a first area for a duration of said first of said successive pulses, and thereafter serially applying other successive pulses of radiant energy from said pulsed laser to other areas of said amorphized layers that at least partially overlaps the previous irradiated area to heat said each of said other areas for the duration of a single one of said successive pulses, the radiation energy of each separate one of said successive pulses being sufficient to heat said amorphized layers in said area irradiated thereby to the melting temperature of said amorphized layers and insufficient to heat said underlying crystalline semiconductor to the melting temperature of said underlying crystalline semiconductor; and (d) providing a time interval between the application of each successive pulse sufficient to permit the melted area of said amorphized layers to recrystallize and cool to an initial temperature prior to the application of a successive pulse to said amorphized layers.

17. The method defined in claim 16, further comprising:

(e) repeating steps (c) and (d) for other parts of said amorphized layers.

18. The method defined in claim 15, further comprising:

(e) repeating steps (c) and (d) for other parts of said amorphized layers.

19. In the method defined in claim 1 said semiconductor substrate is silicon.

20. In the method defined in claim 2 said semiconductor substrate is silicon.

21. In the method defined in claim 3 said semiconductor substrate is silicon.

22. In the method defined in claim 4 said semiconductor substrate is silicon.

23. In the method defined in claim 5 said semiconductor substrate is silicon.

24. In the method defined in claim 6 said semiconductor substrate is silicon.

25. In the method defined in claim 7 said semiconductor substrate is silicon.

26. In the method defined in claim 8 said semiconductor substrate is silicon.

27. In the method defined in claim 9 said semiconductor substrate is silicon.

28. In the method defined in claim 10 said semiconductor substrate is silicon.

29. In the method defined in claim 11 said semiconductor substrate is silicon.

30. In the method defined in claim 12 said semiconductor substrate is silicon.

31. In the method defined in claim 13 said semiconductor substrate is silicon.

32. In the method defined in claim 14 said semiconductor substrate is silicon.

33. In the method defined in claim 15 said semiconductor substrate is silicon.

34. In the method defined in claim 16 said semiconductor substrate is silicon.

35. In the method defined in claim 17 said semiconductor substrate is silicon.

36. In the method defined in claim 18 said semiconductor substrate is silicon.

37. The method defined in claim 3, wherein said semiconductor layer is silicon, said element is germanium, and said concentration per unit area is substantially $2 \times 10^{14}$ atoms/cm$^2$ and said energy level is substantially 20 KeV.

38. The method defined in claim 3, wherein said semiconductor layer is silicon, said element is germanium, and said concentration per unit area is substantially $6 \times 10^{14}$ atoms/cm$^2$ and said energy level is substantially 40 KeV.

* * * * *

UNITED STATES PATENT AND TRADEMARK OFFICE
CERTIFICATE OF CORRECTION

PATENT NO. : 5,908,307
DATED : June 1, 1999
INVENTOR(S) : Somit Talwar, Karl-Josef Kramer, Guarav Verma and Kurt Weiner It is certified that error appears in the above-identified patent and that said Letters Patent is hereby corrected as shown below:

Column 1,
Line 3, to be inserted after the title and before BACKGROUND OF THE INVENTION:

Government Rights
This invention was made with Government support under contract number N66001-95-C-8002 awarded by the Space and naval Warfare Systems Command, San Diego. The Government has certain rights in the invention.

Signed and Sealed this

Sixteenth Day of October, 2001

Attest:

*Nicholas P. Godici*

NICHOLAS P. GODICI
*Attesting Officer*  *Acting Director of the United States Patent and Trademark Office*